United States Patent
Jang

(10) Patent No.: US 9,312,431 B2
(45) Date of Patent: Apr. 12, 2016

(54) METHOD OF CUTTING LIGHT-EMITTING DEVICE CHIP WAFER BY USING LASER SCRIBING

(71) Applicant: SAMSUNG ELECTRONICS CO., LTD., Suwon-si (KR)

(72) Inventor: Yu-sung Jang, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 304 days.

(21) Appl. No.: 13/651,529

(22) Filed: Oct. 15, 2012

(65) Prior Publication Data

US 2013/0171755 A1 Jul. 4, 2013

(30) Foreign Application Priority Data

Dec. 30, 2011 (KR) ......................... 10-2011-0147417

(51) Int. Cl.
*H01L 21/00* (2006.01)
*H01L 33/00* (2010.01)

(52) U.S. Cl.
CPC ........... *H01L 33/0095* (2013.01); *H01L 33/007* (2013.01)

(58) Field of Classification Search
CPC ... H01L 21/78; H01L 33/0095; H01L 21/304; H01L 21/67132; H01L 21/68; H01L 21/6838; H01L 33/007; H01L 2924/12041; H01L 2924/12042; H01L 21/6836; H01L 2221/68327; H01L 33/005

USPC ........................... 438/33; 257/E33.001
See application file for complete search history.

(56) References Cited

U.S. PATENT DOCUMENTS

| | | | | |
|---|---|---|---|---|
| 5,852,624 A | * | 12/1998 | Matsuyama et al. | 372/44.01 |
| 2004/0137699 A1 | * | 7/2004 | Kurosawa | 438/460 |
| 2004/0198024 A1 | * | 10/2004 | Yoon et al. | 438/463 |
| 2008/0318395 A1 | * | 12/2008 | Farnworth et al. | 438/462 |
| 2009/0236324 A1 | * | 9/2009 | Fukuyo et al. | 219/121.72 |
| 2011/0287608 A1 | * | 11/2011 | Saegusa et al. | 438/462 |
| 2011/0315999 A1 | * | 12/2011 | Sharma et al. | 257/76 |

FOREIGN PATENT DOCUMENTS

| | | | |
|---|---|---|---|
| JP | 2003-209073 A | | 7/2003 |
| JP | 2005-184032 A | | 7/2005 |
| KR | 2000-0008966 A | | 2/2000 |
| KR | 20000008966 | * | 2/2000 |
| KR | 2002-0076836 A | | 10/2002 |
| KR | 10-0539271 B1 | | 12/2005 |
| KR | 10-1043836 B1 | | 6/2011 |
| WO | WO2010087249 | * | 8/2010 |

* cited by examiner

*Primary Examiner* — Duy T Nguyen
(74) *Attorney, Agent, or Firm* — Sughrue Mion, PLLC

(57) ABSTRACT

Methods of cutting a light-emitting device chip wafer by using a laser scribing process. The method includes: preparing a wafer that has a plurality of semiconductor chips on an upper surface of the wafer; attaching a first tape covering the semiconductor chips to the upper surface of the wafer; forming scribing lines to define each of the semiconductor chips on the wafer by irradiating a laser beam onto a lower surface of the wafer; attaching a second tape to the lower surface of the wafer; and breaking the wafer into a plurality of chips by applying a physical force to the wafer along the scribing lines.

9 Claims, 3 Drawing Sheets

METHOD OF CUTTING LIGHT-EMITTING DEVICE CHIP WAFER BY USING LASER SCRIBING

CROSS-REFERENCE TO RELATED APPLICATIONS

This application claims the benefit of Korean Patent Application No. 10-2011-0147417, filed on Dec. 30, 2011, in the Korean Intellectual Property Office, the disclosure of which is incorporated herein in its entirety by reference.

BACKGROUND

1. Field

The present disclosure relates to methods of cutting a light-emitting device chip wafer on which a plurality of light-emitting device chips are formed using laser scribing.

2. Description of the Related Art

Light-emitting device chips, e.g., light-emitting diodes (LEDs), are semiconductor devices that realize various light colors by configuring a light source through a PN junction of compound semiconductors. LEDs have a long lifespan, may be miniaturized and manufacture light, and may be driven at a low voltage due to high directionality. Also, LEDs are resilient to impact and vibration, do not require a preheating time and a complicated driving, and may be packaged in various types. Accordingly, LEDs may be applied for various purposes.

When an LED is manufactured using a semiconductor manufacturing process, a plurality of light-emitting device chips are formed on a wafer to increase productivity.

In order to separate the light-emitting device chips, the light-emitting device chips of the wafer are each cut. After the light-emitting device chips are separated by using a wafer cutting process, the characteristics of electrodes of each of the light-emitting device chips are inspected through contact with a multi-probe.

In a related art, after attaching a protection tape on a side of the wafer, the wafer is cut by using a sawing blade, i.e., a rotating blade wheel, in a mechanical cutting process. However, the mechanical cutting process may contaminate the environment due to dust, generated during the mechanical cutting process. Also, a contact failure between electrodes and a multi-probe may occur due to a disorder of alignment of the separated light-emitting device chips on the protection tape. Thus, the contact failure may cause problems in the light-emitting device chips.

SUMMARY

Disclosed are methods of cutting light-emitting device chip wafers to increase the productivity of a cutting process by separating the light-emitting device chips by using a laser scribing process and a breaking process.

Additional aspects will be set forth in part in the description which follows and, in part, will be apparent from the description, or may be learned by practice of the presented embodiments.

According to an aspect of the exemplary embodiments, there is provided a method of cutting a wafer, the method including: preparing the wafer having a plurality of semiconductor chips on an upper surface of the wafer; attaching a first tape covering the semiconductor chips to the upper surface of the wafer; forming scribing lines to define each of the semiconductor chips on the wafer by irradiating a laser beam onto a lower surface of the wafer; attaching a second tape to the lower surface of the wafer; and breaking the wafer into a plurality of chips by applying a physical force to the wafer along the scribing lines.

The semiconductor chips may be light-emitting device chips.

The wafer may be a sapphire wafer through which the laser beam passes.

The forming of the scribing lines may include irradiating the laser beam in a thickness direction, so that the laser beam is focused approximately in a middle position of the thickness of the wafer.

The forming of the scribing lines may include forming the scribing lines in a lattice type, that is, in an X direction and a Y direction of the wafer, while moving an X-Y stage that supports the wafer in the X direction and the Y direction.

The breaking of the wafer may include cutting the wafer by pressing the wafer along the scribing lines by using a break blade.

According to a further aspect of the exemplary embodiments, there is provided a wafer, the wafer including a plurality of semiconductor chips on an upper surface of the wafer; a first tape, which covers the semiconductor chips and is attached to the upper surface of the wafer; and a second tape, which is attached to a lower surface of the wafer, wherein scribing lines are formed to define each of the semiconductor chips on the wafer.

According to the exemplary embodiments, the failure rate of light-emitting device chips may be reduced by reducing particles generated from a cutting process.

Also, because a tape that fixes the light-emitting device chips is attached onto both surfaces of a wafer, after cutting the wafer, the positions of the light-emitting device chips are fixed. Accordingly, characteristics of each of the light-emitting device chips may be inspected using a multi-probe.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
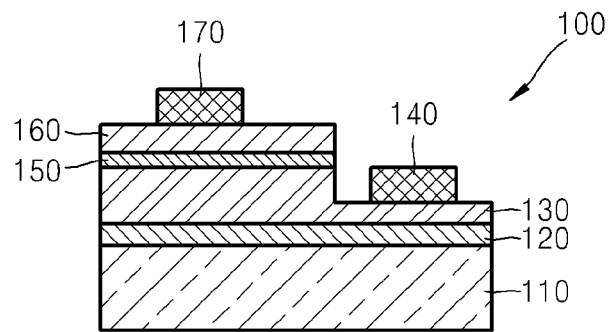
FIG. 1 is a schematic cross-sectional view of an example of a light-emitting device chip according to an embodiment.

Reference will now be made in detail to embodiments, examples of which are illustrated in the accompanying drawings. In the drawings, like reference numerals refer to like elements throughout and the thicknesses or sizes of elements are exaggerated for convenience of explanation and clarity. It will be understood that when an element or layer is referred to as being "on" another element or layer, it can be directly or indirectly formed on the other element or layer. For example, intervening elements or layers may be present.

FIG. 1 is a schematic cross-sectional view of an example of a light-emitting device chip according to an embodiment of the present invention.

Referring to FIG. 1, a buffer layer 120 is formed on a substrate 110. The substrate 110 may be a sapphire substrate 110. The buffer layer 120 may be formed of $In_xGa_yAl_zN$, $ZrB_2$, $HfB_2$, $ZrN$, $HfN$, $TiN$, or $AlN$. An n-type nitride layer 130 is formed on the buffer layer 120. The buffer layer 120 is formed to mitigate lattice misalignment between the n-type nitride layer 130 and the sapphire substrate 110. The n-type nitride layer 130 may be formed of $In_xGa_yAl_zN$. The n-type nitride layer 130 may be formed as a single layer or a plurality of layers, compositions thereof vary. A portion of the n-type nitride layer 130 is exposed, and an n-type electrode pad 140 may be formed on the exposed portion of the n-type nitride layer 130. A multiple quantum well active layer 150 and a p-type nitride layer 160 are sequentially formed on a portion of the first nitride layer 130. A p-type electrode pad 170 is formed on the p-type nitride layer 160.

In FIG. 1, the light-emitting device chip 100 has a horizontal type electrode structure. However, the light-emitting device chip 100 according to the current embodiment is not limited. For example, the light-emitting device chip may have a vertical type electrode structure.

FIGS. 2A through 2D are schematic cross-sectional views showing a method of cutting a wafer by using a laser scribing process, according to an embodiment.

Figure 2A:
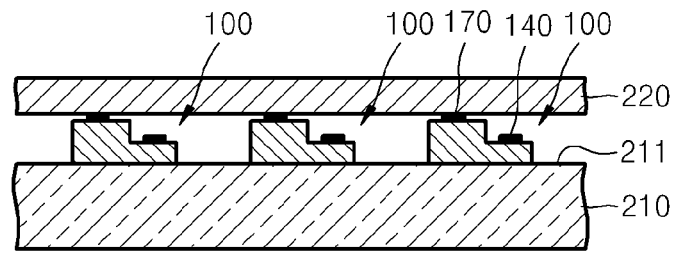
FIGS. 2A-2D are schematic cross-sectional views showing a method of cutting a wafer by using a laser scribing process, according to an embodiment.

Referring to FIG. 2A, the wafer 210 has a plurality of semiconductor chips prepared on an upper surface 211. The semiconductor chips may be light-emitting device chips 100. The wafer 210 may be formed of sapphire, and the light-emitting device chips 100 may be GaN group light-emitting diodes formed on the wafer 210. The light-emitting device chips 100 may be arranged in a matrix on the wafer 210. For convenience, three light-emitting device chips 100 are depicted in FIG. 2A. However, embodiments are not limited to three light-emitting device chips 100. The light-emitting device chips 100 may also have various structures. As an example, the light-emitting device chips 100 may each include the horizontal light-emitting device chip 100 of FIG. 1.

A first tape 220 may be attached above the upper surface 211 of the wafer 210 to cover the light-emitting device chips 100. The first tape 220 fixes the wafer 210 in a laser scribing process and a cutting process. The first tape 220 is not specifically limited and may be any tape that provides adhesiveness. For example, the first tape 220 may be an ultraviolet tape (UV tape), or a thermosetting tape. The first tape 220 may be formed to have a thickness in a range from about 50 μm to about 200 μm.

In FIG. 2A, a gap between the light-emitting device chips 100 and the first tape 220 is shown to be very large. The first tape 220 is also shown to be separated from the upper surface 211 of the wafer 210. However, in practice, the light-emitting device chips 100 formed on the wafer 210 may have a height of a few μm, and the first tape 220 may contact entire surfaces of the light-emitting device chips 100 and the upper surface 211 of the wafer 210.

Figure 3:
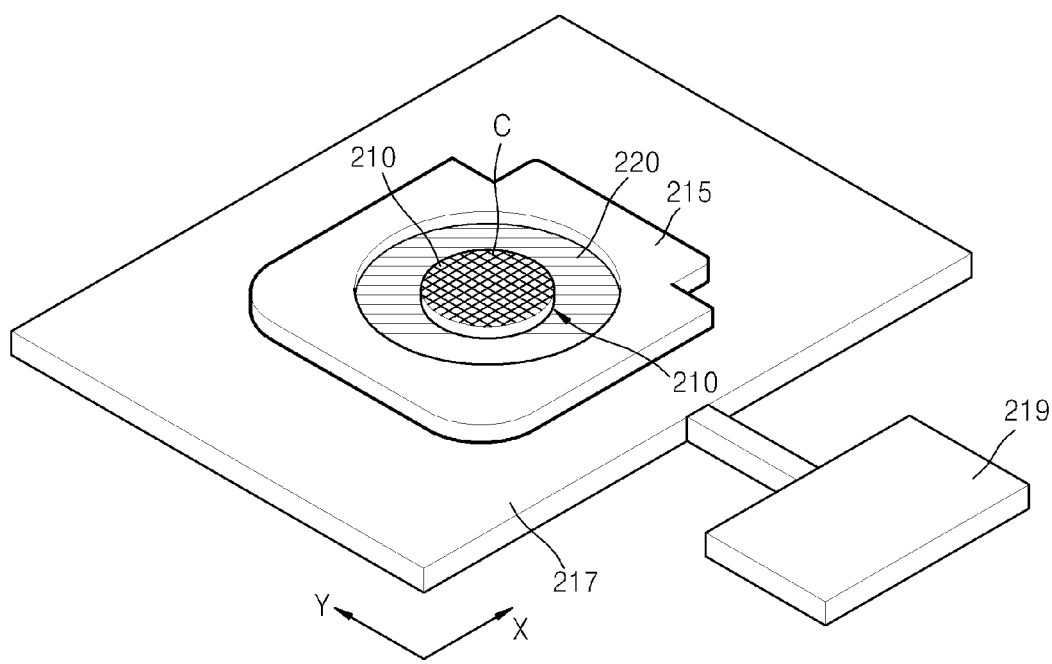
FIG. 3 is a perspective view of a wafer ring on which a wafer is mounted.

FIG. 3 is a perspective view of a wafer ring 215 on which the wafer 210 is mounted. The first tape 220 may be attached, in advance to the wafer ring 215, where the upper surface 211 of the wafer 210 is attached. Lines C define each of the light-emitting device chips 100 and may be lines to be scribed.

Figure 2B:
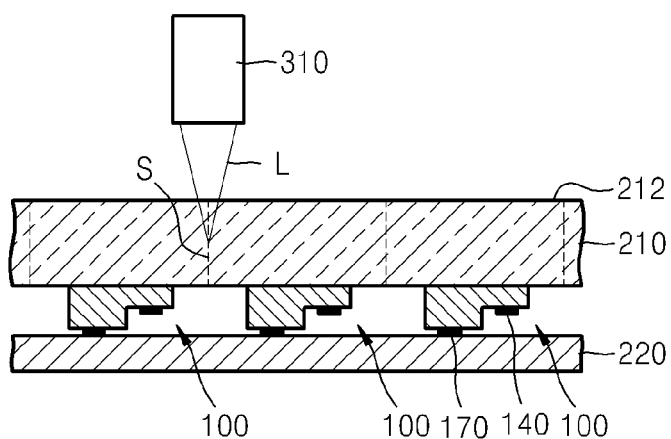

Referring to FIG. 2B, the wafer 210 is disposed on an X-Y stage (217 in FIG. 3). When the wafer ring 215 is used, the wafer ring 215 is mounted on the X-Y stage 217. A driving device (219 in FIG. 3) moves the X-Y stage 217 in two axes directions (X-Y axis). A description of the X-Y stage 217 is omitted.

A laser apparatus 310 that irradiates a laser beam L is disposed on the X-Y stage 217. While moving the X-Y stage 217 in the X direction and the Y direction step-by-step, scribing lines S, that define each of the light-emitting device chips 100, are formed on the wafer 210 by irradiating the laser beam L onto a lower surface 212 of the wafer 210. The wafer 210 may be a sapphire substrate through which a laser beam L may pass. The scribing lines S formed on the wafer 210 are formed in a lattice type to define the light-emitting device chips 100 formed in a matrix. The scribing lines S and the lines C in FIG. 3 may be at a same position.

The laser apparatus 310 for example, may be a fiber laser with a power in a range from about 0.25 W to about 0.4 W. The moving speed of the X-Y 217 stage may be approximately 400 mm/s. Cracks may be formed along the scribing lines S of the wafer 210 by irradiating a laser beam L so that the laser beam L is focused in the middle of the thickness of the wafer 210.

Figure 2C:
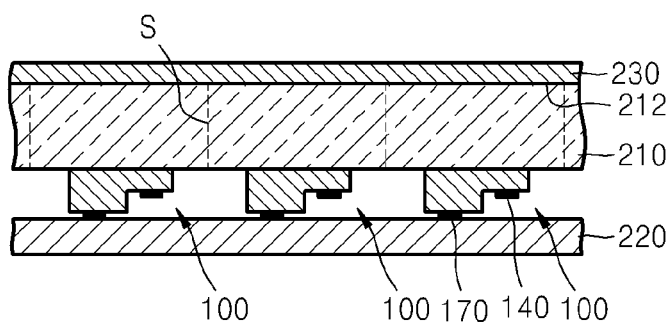

Referring to FIG. 2C, a second tape 230 is attached on the lower surface 212 of the wafer 210. The second tape 230 may be any tape that provides adhesiveness. For example, the second tape 230 may be a UV tape or a thermosetting tape having a thickness in a range from about 50 μm to about 200 μm.

The attachment of the second tape 230 may be performed when the wafer 210 is mounted on the wafer ring 215 in a state that the wafer ring 215 is mounted on the X-Y stage 217.

Figure 2D:
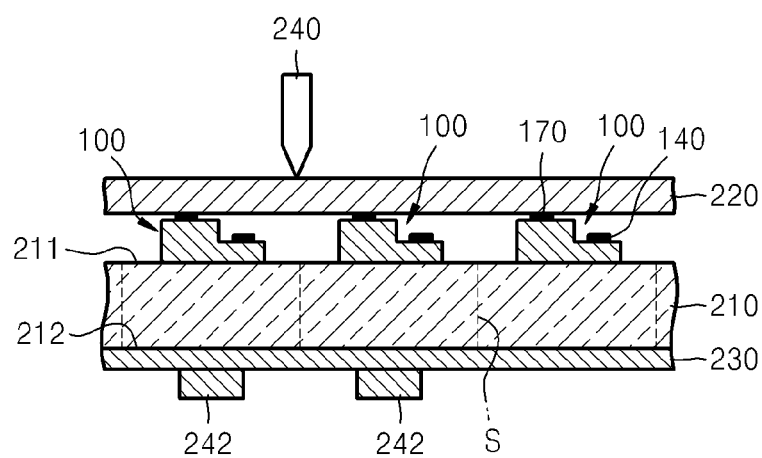

Referring to FIG. 2D, a breaking process for cutting the wafer 210 is performed on the scribing lines S of the wafer 210. After aligning the lower surface 212 of the wafer 210 so that the scribing lines S are disposed between a pair of breaking blocks 242, the upper surface 211 of the wafer 210 is pressed with respect to the scribing lines S by using a break blade 240, such that the wafer 210 is cut along the scribing lines S formed on the wafer 210. At this point, the light-emitting device chips 100 formed on the wafer 210 are also separated. The pair of breaking blocks 242 may be longer than the diameter of the wafers 210.

When the scribing operations are repeated while moving the X-Y stage 217, the wafer 210 is separated into each of the light-emitting device chips 100. In this process, the first tape 220 and the second tape 230 are not cut in the breaking process. Accordingly, the separated light-emitting device chips 100 are fixed. In other words, the positions of each of the light-emitting device chips 100 are fixed.

Next, after removing the first tape 220, that covers the light-emitting device chips 100, characteristics of each of the light-emitting device chips 100 may be inspected using a multi-probe. In this process, a contact error between the multi-prober and the electrode pads of the light-emitting device chips 100 is reduced. Thus, the productivity for manufacturing the light-emitting device chips 100 may be increased.

When a laser scribing process is used, instead of a mechanical cutting process, the failure of light-emitting device chips due to particles generated from the mechanical cutting process may be reduced. Also, because a tape that fixes the light-emitting device chips is attached onto both surfaces of a wafer, after cutting the wafer, the positions of the light-emitting device chips are fixed. Accordingly, characteristics of each of the light-emitting device chips may be inspected, by using a multi-probe without a contact failure between the light-emitting device chips and the multi-probe. Thus, productivity of manufacturing the light-emitting device chips may be increased.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A method of cutting a wafer, the method comprising:
preparing the wafer having a plurality of semiconductor chips on an upper surface of the wafer;
attaching a first tape covering the semiconductor chips to the upper surface of the wafer;
forming scribing lines to define each of the semiconductor chips on the wafer by irradiating a laser beam onto a lower surface of the wafer;
attaching a second tape to the lower surface of the wafer; and
cutting the wafer into a plurality of chips by applying a physical force to the wafer along the scribing lines, while the first and second tapes remain attached to the upper surface and the lower surface of the wafer, respectively,
wherein the first tape and the second tape are not cut during the cutting of the wafer.

2. The method of claim 1, wherein the semiconductor chips are light-emitting device chips.

3. The method of claim 2, wherein the wafer is a sapphire wafer through which the laser beam passes.

4. The method of claim 1, wherein the forming of the scribing lines comprises irradiating the laser beam in a thickness direction, so that the laser beam is focused approximately in a middle position of the thickness of the wafer.

5. The method of claim 1, wherein the forming of the scribing lines comprises forming the scribing lines in an X direction and a Y direction of the wafer, while moving an X-Y stage that supports the wafer in the X direction and the Y direction.

6. The method of claim 1, wherein the cutting of the wafer comprises cutting the wafer by pressing the wafer along the scribing lines by using a break blade.

7. The method of claim 1, further comprising, after the attaching of the second tape and prior to the cutting of the wafer:
preparing at least one pair of breaking blocks on the second tape such that the scribing lines are respectively positioned between each of the at least one pair of breaking blocks.

8. The method of claim 1, wherein the attaching of the first tape is performed prior to the attaching of the second tape.

9. A method of cutting a wafer, the method comprising:
preparing the wafer having a plurality of semiconductor chips on an upper surface of the wafer;
mounting the wafer on a wafer ring having a first tape attached thereto such that the first tape covers the semiconductor chips on the upper surface of the wafer;
forming scribing lines to define each of the semiconductor chips on the wafer by irradiating a laser beam onto a lower surface of the wafer while moving the wafer ring in a predetermined direction;
after forming the scribing lines, attaching a second tape to the lower surface of the wafer; and
cutting the wafer into a plurality of chips by applying a physical force to the upper surface of the wafer along the scribing lines, while the first and second tapes remain attached to the upper surface and the lower surface of the wafer, respectively,
wherein the first tape and the second tape are not cut during the cutting of the wafer.

* * * * *